(12) United States Patent
Trouilloud et al.

(10) Patent No.: US 7,061,787 B2
(45) Date of Patent: Jun. 13, 2006

(54) FIELD RAMP DOWN FOR PINNED SYNTHETIC ANTIFERROMAGNET

(75) Inventors: Philip Louis Trouilloud, Norwood, NJ (US); Ulrich Klostermann, Fontainebleau (FR)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 223 days.

(21) Appl. No.: 10/835,623

(22) Filed: Apr. 30, 2004

(65) Prior Publication Data

US 2005/0243600 A1 Nov. 3, 2005

(51) Int. Cl.
*G11C 11/22* (2006.01)
(52) U.S. Cl. ........................ 365/145; 365/158; 365/173; 360/324.11; 438/3
(58) Field of Classification Search ................ 365/145, 365/173, 225.5, 158, 65, 66; 360/324.11; 438/3
See application file for complete search history.

(56) References Cited

U.S. PATENT DOCUMENTS

| 5,465,185 | A | * | 11/1995 | Heim et al. ............ 360/324.11 |
| 6,667,897 | B1 | * | 12/2003 | Abraham et al. ........... 365/145 |
| 2005/0105355 | A1 | * | 5/2005 | Brueckl et al. ............. 365/222 |
| 2005/0164414 | A1 | * | 7/2005 | Deak ............................. 438/3 |

OTHER PUBLICATIONS

Beach et al., "AP-pinned spin valve GMR and magnetization," Journal of Applied Physics, vol. 87, No. 9, (2000).

* cited by examiner

*Primary Examiner*—Richard Elms
*Assistant Examiner*—Toan Le
(74) *Attorney, Agent, or Firm*—Ryan, Mason & Lewis, LLP

(57) ABSTRACT

Techniques for processing magnetic devices are provided. In one aspect, a method of processing a magnetic device including two or more anti-parallel coupled layers comprises the following steps. A magnetic field is applied in a given direction to orient a direction of magnetization of the two or more anti-parallel coupled layers. The direction of the applied magnetic field is rotated in relation to a positioning of the two or more anti-parallel coupled layers to counteract at least a portion of a change in a direction of magnetization experienced by at least one of the two or more anti-parallel coupled layers when the applied magnetic field is reduced.

20 Claims, 4 Drawing Sheets

FIELD RAMP DOWN FOR PINNED SYNTHETIC ANTIFERROMAGNET

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

The present invention relates to magnetic devices and, more particularly, to techniques for processing magnetic devices.

BACKGROUND OF THE INVENTION

Certain magnetic devices, e.g., magnetic random access memory (MRAM) devices, use magnetic memory cells to store information. Each magnetic memory cell typically comprises a submicron piece of magnetic materials, e.g., having the dimensions of 300 nanometers (nm) by 300 nm in area and ten nm thick.

Information is stored in such magnetic devices as the orientation of the magnetization of a storage layer in the magnetic memory cell as compared to the orientation of the magnetization of a reference layer in the memory cell. The magnetization of the storage layer may be oriented parallel or anti-parallel to the reference layer, representing either a logic "0" or a "1." The orientation of the magnetization of a given layer (storage or reference) may be represented by an arrow pointing either to the left or to the right. When the magnetic memory cell is sitting in a zero applied magnetic field, the magnetization of the storage layer is stable, pointing either right or left. The application of magnetic fields can change the magnetization of the storage layer from right to left, and vice versa, to write information to the magnetic memory cell.

A single reference layer may be replaced by two tightly anti-parallel coupled layers. While two anti-parallel coupled layers perform the same function as a single layer, the combined effective magnetic thickness of the two layers can be reduced (e.g., as compared to a single reference layer), resulting in a reduction in stray magnetic fields being generated (which can affect the storage layer) and a reduction in the susceptibility of the reference layer to perturbations.

A magnetic memory device having two anti-parallel coupled layers, however, is more difficult to set in a desired reference direction (the layers have magnetization properties that are different from a comparable single storage layer device). Namely, as the magnetic field associated with the device changes, the magnetic moments of each of the two anti-parallel coupled layers may "scissor," both in relation to each other, as well as in relation to the direction of the magnetic field. See for example, M. Pinarbasi et al., *AP-pinned Spin Valve GMR and Magnetization*, JOURNAL OF APPLIED PHYSICS, vol. 87, n. 9, pgs. 5723–5725, the disclosure of which is incorporated by reference herein, wherein the magnetic moments of two coupled layers are shown to "scissor" in relation to each other with a change in the magnetic field.

This "scissor" effect, which can occur during the fabrication of the magnetic memory device, can lead to deviations in the desired orientation of the magnetization of one or more of the magnetic layers. Such deviations can result in inaccurate and/or unreliable performance of the device.

Therefore, techniques are needed for fabricating magnetic memory devices wherein deviations in the orientation of the magnetization are reduced or eliminated.

SUMMARY OF THE INVENTION

The present invention provides techniques for processing magnetic devices. In one aspect of the invention, a method of processing a magnetic device comprising two or more anti-parallel coupled layers comprises the following steps. A magnetic field is applied in a given direction to orient a direction of magnetization of the two or more anti-parallel coupled layers. The direction of the applied magnetic field is rotated in relation to a positioning of the two or more anti-parallel coupled layers to counteract at least a portion of a change in a direction of magnetization experienced by at least one of the two or more anti-parallel coupled layers when the applied magnetic field is reduced.

In another aspect of the invention, a magnetic device comprising two or more anti-parallel coupled layers is formed comprising the following steps. A magnetic field is applied in a given direction to orient a direction of magnetization of the two or more anti-parallel coupled layers. The direction of the applied magnetic field is rotated in relation to a positioning of the two or more anti-parallel coupled layers to counteract at least a portion of a change in a direction of magnetization experienced by at least one of the two or more anti-parallel coupled layers when the applied magnetic field is reduced.

A more complete understanding of the present invention, as well as further features and advantages of the present invention, will be obtained by reference to the following detailed description and drawings.

DETAILED DESCRIPTION OF PREFERRED EMBODIMENTS

Figure 1:
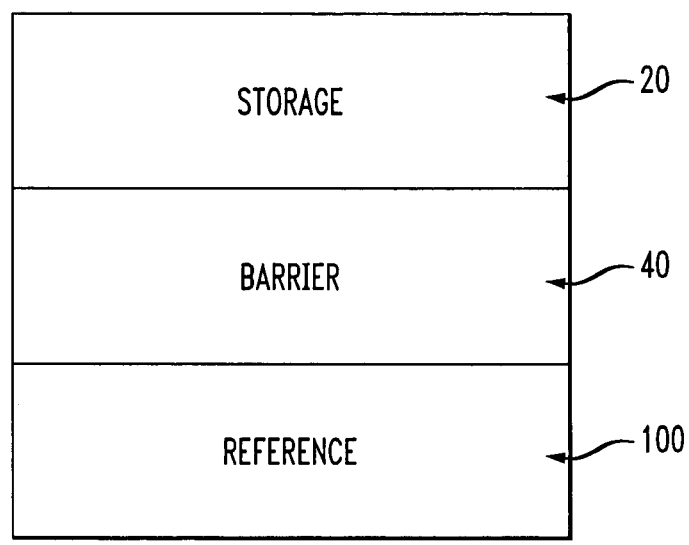
FIG. 1 is a diagram illustrating an exemplary magnetic device configuration according to an embodiment of the present invention.

FIG. 1 is a diagram illustrating an exemplary magnetic device configuration. In FIG. 1, magnetic device 10 comprises storage stack 20 (labeled "Storage"), barrier stack 40 (labeled "Barrier") and reference stack 100 (labeled "Reference"). The term "stack," as used herein, refers to each of, e.g., storage stack 20, barrier stack 40 and reference stack 100, comprising one or more layers. For example, as will be described in detail below, reference stack 100 may comprise multiple layers.

The term "magnetic device," as used herein, is intended to include magnetic device structures, such as magnetic memory devices, and all components and stages of preparation thereof, including, for example, magnetic materials (either patterned or unpatterned), magnetic memory devices, such as, but not limited to, magnetic random access memory (MRAM) devices, magnetic recording heads, magnetic tunnel junctions or giant magnetoresistive (GMR) devices. Further, magnetic device 10 may be part of an integrated circuit.

Figure 2:
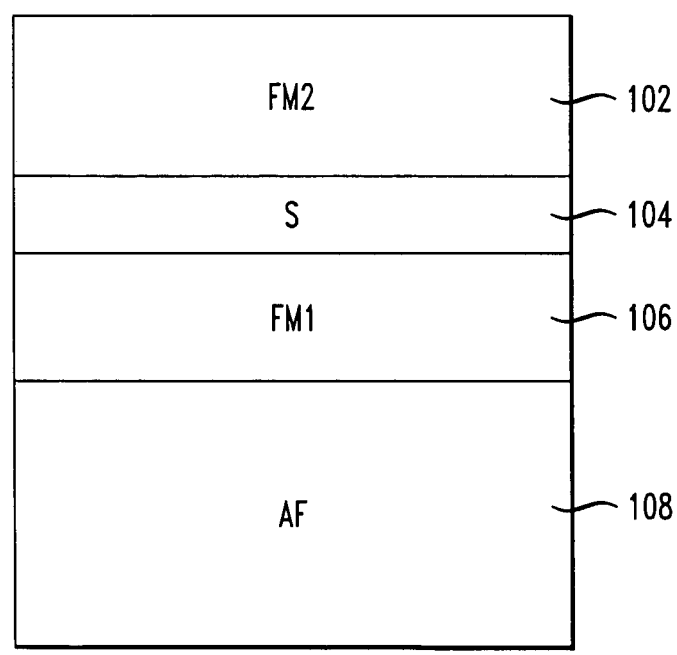
FIG. 2 is a diagram illustrating an exemplary reference stack configuration according to an embodiment of the present invention.

FIG. 2 is a diagram illustrating an exemplary reference stack configuration, e.g., reference structure 100 described in conjunction with the description of FIG. 1 above. In FIG. 2, reference stack 100 comprises a first ferromagnetic layer 106 (labeled "FM1"), a spacer layer 104 (labeled "S"), a second ferromagnetic layer 102 (labeled "FM2") and an anti-ferromagnetic layer 108 (labeled "AF"). Specifically, ferromagnetic layer 102 and ferromagnetic layer 106 are tightly anti-parallel coupled by spacer layer 104 therebetween.

Each of ferromagnetic layer 102 and ferromagnetic layer 106, which may have the same or different compositions from each other, may comprise any suitable ferromagnetic materials including, but not limited to, nickel (Ni)/iron (Fe) alloys (NiFe), cobalt (Co)/Fe alloys (CoFe) and combinations comprising at least one of the foregoing ferromagnetic materials. In an exemplary embodiment, ferromagnetic layer 102 and ferromagnetic layer 106 have the same composition, each comprising NiFe. Further, ferromagnetic layer 102 and/or ferromagnetic layer 106 may comprise a single layer, or alternatively, multiple layers comprising, e.g., NiFe/CoFe. Further, the multiple layers may comprise, for example, only ferromagnetic layers, or alternatively, ferromagnetic/non-ferromagnetic layer combinations (for example, copper (Cu) layer(s) may be employed as a non-ferromagnetic layer between two or more ferromagnetic layers).

Spacer layer 104 may comprise any material suitable for anti-parallel coupling ferromagnetic layer 102 and ferromagnetic layer 106, including, but not limited to ruthenium (Ru). To anti-parallel couple ferromagnetic layer 102 and ferromagnetic layer 106, spacer layer 104 has a thickness of less than or equal to about two nanometers (nm). For example, spacer layer 104 may have a thickness of less than or equal to about 0.8 nm.

In an exemplary embodiment, ferromagnetic layer 102 is tightly anti-parallel coupled to ferromagnetic layer 106 without a spacer layer therebetween. In this embodiment, the anti-parallel coupling of ferromagnetic layer 102 and ferromagnetic layer 106 is generated by magnetostatic coupling or dipole coupling between the layers. Anti-parallel coupling according to this embodiment may be employed when the magnetic device, e.g., comprises patterned films. As such, the techniques presented herein are broadly applicable to magnetic device processing and apply to various configurations, such as, patterned films and sheet films.

Having ferromagnetic layer 102 tightly anti-parallel coupled to ferromagnetic layer 106 is advantageous as it allows for a reduction in the overall magnetic thickness of the reference stack 100, as compared to a single layer reference stack, while performing the same function. However, as will be described in detail below, employing a reference stack comprising tightly anti-parallel coupled ferromagnetic layers, as opposed to a single layer reference stack, impacts the magnetization properties, including the direction of magnetization, of reference stack 100.

Anti-ferromagnetic layer 108 is associated with the tightly anti-parallel coupled ferromagnetic layer 102 and ferromagnetic layer 106. For example, in the configuration shown in FIG. 2, anti-ferromagnetic layer 108 is present on a side of ferromagnetic layer 106 opposite second ferromagnetic layer 102 and spacer layer 104. The techniques presented herein should, however, not be limited to any particular magnetic device configuration.

As will be described in detail below, in an exemplary embodiment, during the fabrication of reference stack 100, one or more of the layers, e.g., ferromagnetic layer 102 and/or ferromagnetic layer 106, each of which inherently possesses a magnetization oriented in a particular direction, may be used to orient the direction of magnetization of anti-ferromagnetic layer 108, which does not inherently possess any particular direction of magnetization. For example, in the exemplary configuration shown in FIG. 2, ferromagnetic layer 106 may be used to orient the direction of magnetization of anti-ferromagnetic layer 108 during the fabrication of reference stack 100.

Further, as will also be described in detail below, the direction of magnetization of anti-ferromagnetic layer 108 may be set during the fabrication of magnetic device 100. The direction of magnetization of anti-ferromagnetic layer 108 refers to the natural pinning direction of magnetization given by, e.g., the ferromagnetic/anti-ferromagnetic interface of ferromagnetic layer 106/anti-ferromagnetic layer 108, respectively. Once the direction of magnetization of anti-ferromagnetic layer 108 is set, it may then be used to pin the direction of magnetization of one or more of the layers comprising reference stack 100. For example, in the exemplary configuration shown in FIG. 2, anti-ferromagnetic layer 108 may be used to pin the direction of magnetization of ferromagnetic layer 106.

In an exemplary embodiment, an anti-ferromagnetic layer is not present. In this embodiment, a difference in the coercivities of ferromagnetic layers 102 and 106, coupled together, perform similarly to the configuration depicted, e.g., in FIG. 2.

Figure 3:
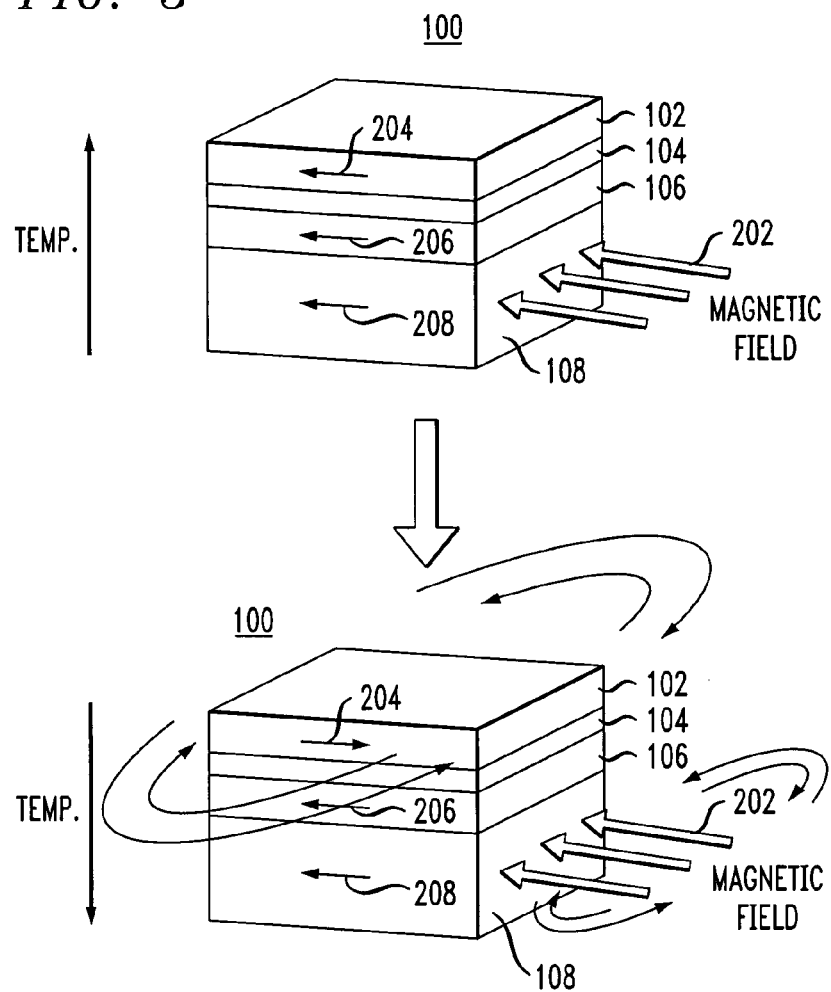
FIG. 3 is a diagram illustrating an exemplary technique for processing a reference stack according to an embodiment of the present invention.

FIG. 3 is a diagram illustrating an exemplary technique for processing a reference stack. As shown in FIG. 3, reference stack 100 has the same configuration as that described in conjunction with the description of FIG. 2, above. Namely, FIG. 3 illustrates processing steps performed during the fabrication of reference stack 100 to accurately orient the direction of magnetization of each magnetic layer, e.g., directions of magnetization 204, 206 and 208 of ferromagnetic layer 102, ferromagnetic layer 106 and anti-ferromagnetic layer 108, respectively, of reference stack 100.

During fabrication of reference stack 100, the direction of magnetization of anti-ferromagnetic layer 108, ferromagnetic layer 102 and ferromagnetic layer 106 needs to be set. When present, the direction of magnetization of anti-ferromagnetic layer 108 may be achieved through annealing techniques. Namely, reference stack 100 is heated in the presence of an applied magnetic field, e.g., magnetic field 202, inducing a particular direction of magnetization of reference stack 100. In an exemplary embodiment, reference stack 100 is heated at a temperature of from about 250 degrees Celsius (° C.) to about 300° C. for a duration of from about one hour to about five hours, e.g., a longer durations for lower temperatures. For sufficiently high magnetic fields (e.g., above the saturation field of the reference layers) both ferromagnetic layers 102 and 106 are aligned parallel along the field direction. Upon removal of the applied field, ferromagnetic layer 102 (anti-parallel coupled to ferromagnetic layer 106) will relax to the anti-parallel direction. When the heat and the applied magnetic field are removed, ferromagnetic layer 106 will retain substantially the same direction of magnetization as the applied magnetic field. Substantially similar directions of magnetization will be described in detail below.

For a reference stack configuration such as that shown in FIGS. 2 and 3, annealing comprises heating reference stack 100 to a temperature of greater than or equal to the blocking temperature of the device. The blocking temperature is the temperature at which any exchange bias between, e.g., anti-ferromagnetic layer 108 and ferromagnetic layer 106, vanishes.

As mentioned above, ferromagnetic layer 106 may be used to set the pinning direction of anti-ferromagnetic layer 108 during processing of reference stack 100. In the configuration depicted in FIG. 3, ferromagnetic layer 106 may be used during annealing of reference stack 100 to set the direction of magnetization of anti-ferromagnetic layer 108. Namely, both direction of magnetization 204 and direction of magnetization 206 of ferromagnetic layer 102 and ferromagnetic layer 106, respectively, will align with the applied magnetic field. When the heat is removed and the temperature drops below the blocking temperature of anti-ferromagnetic layer 108, magnetization 206 will then align the pinning direction of anti-ferromagnetic layer 108 with the applied magnetic field, e.g., magnetic field 202. When the applied magnetic field is later ramped down, e.g., reduced and/or removed (reduced to zero), anti-ferromagnetic layer 108 will retain the pinning direction of ferromagnetic layer 106 (i.e., along initially applied magnetic field 202). Ramp down of the applied magnetic field may be conducted at any time after the temperature drops below the blocking temperature of anti-ferromagnetic layer 108. Therefore, while suitable to do so, it is not necessary to wait for the temperature to drop down to room temperature (e.g., from about 21° C. to about 23° C.) before beginning the ramp down of the magnetic field.

When the applied magnetic field is ramped down, the direction of magnetization of some of the layers comprising the reference stack 100, e.g., ferromagnetic layer 102 and ferromagnetic layer 106, changes, e.g., rotates. Namely, direction of magnetization 204 and direction of magnetization 206 of ferromagnetic layer 102 and ferromagnetic layer 106, respectively, "scissor" in relation to each other, and in relation to the direction of the applied magnetic field. For example, in the embodiment depicted in FIG. 3, direction of magnetization 204 of ferromagnetic layer 102 will rotate 180 degrees, and thus essentially point in a direction opposite to the direction of the applied magnetic field 202. Direction of magnetization 206 of ferromagnetic layer 106 will also undergo an angular excursion, e.g., rotate, up to about 60 degrees from the direction of magnetization of applied magnetic field 202. The quantification of rotations in the direction(s) of magnetization will be described in detail below, for example, in conjunction with the description of FIG. 4.

Despite these rotations in the direction of magnetization, it is desired that one of the layers, e.g., ferromagnetic layer 106, relaxes to have a direction of magnetization, e.g., direction of magnetization 206, substantially similar to direction of magnetization 208 of anti-ferromagnetic layer 108, to which it is pinned, and the other layer, e.g., ferromagnetic layer 102, has direction of magnetization 204 opposite to direction of magnetization 206 of ferromagnetic layer 106, to which it is anti-parallel coupled. Substantially similar directions of magnetization, as described in conjunction with the description of FIG. 3 below, comprise those directions of magnetization that differ by less than or equal to about ten degrees.

However, during the magnetic field ramp down, when the direction of magnetization 204 and direction of magnetization 206 of ferromagnetic layer 102 and ferromagnetic layer 106, respectively, rotate, factors exist that cause direction of magnetization 206 of ferromagnetic layer 106 to relax in a direction deviating from direction of magnetization 208 of anti-ferromagnetic layer 108, such that direction of magnetization 206 is not substantially similar to direction of magnetization 208. Factors that cause such a deviation include, for example, an amount of coercivity that exists between, e.g., ferromagnetic layer 106 and anti-ferromagnetic layer 108. Deviations in direction of magnetization 206 of ferromagnetic layer 106 can lead to imprecise performance of magnetic device 100.

One exemplary technique that may be employed to reduce, or eliminate, such deviations in the directions of magnetization is to reduce, or eliminate, rotations in the directions of magnetization of one or more of the layers during fabrication of reference stack 100 (as described above). For example, reducing, or eliminating, rotations in direction of magnetization 206 of ferromagnetic layer 106 during ramp down of magnetic field 202 during fabrication of reference stack 100 can significantly reduce or eliminate any deviations in direction of magnetization 206 in completed reference stack 100.

Reducing or eliminating rotations in direction of magnetization 206 of ferromagnetic layer 106 may be achieved by rotating the direction of the applied magnetic field, e.g., magnetic field 202, in relation to a positioning of reference stack 100 to counteract at least a portion of the rotations in direction of magnetization 206. Rotating the direction of the applied magnetic field in relation to a positioning of reference stack 100 may comprise changing the direction of the applied magnetic field, rotating the positioning of reference stack 100 or both changing the direction of the applied magnetic field and rotating the positioning of reference stack 100, as shown in FIG. 3. Changing the direction of the applied magnetic field and/or rotating the positioning of reference stack 100 can counteract at least some, if not all, of the rotations in direction of magnetization 206 of ferromagnetic layer 106, as will be described in conjunction with the descriptions of FIG. 6 and FIG. 7, below.

Figure 4:
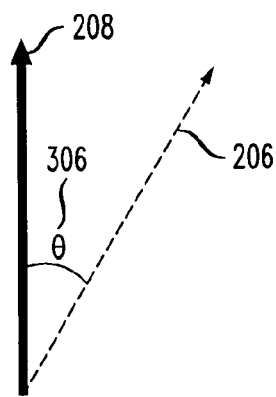
FIG. 4 is a diagram illustrating direction of magnetization angles according to an embodiment of the present invention.

FIG. 4 is a diagram illustrating direction of magnetization angles. As shown in FIG. 4, direction of magnetization 206 (e.g., of ferromagnetic layer 106) is substantially similar to direction of magnetization 208 (e.g., of anti-ferromagnetic layer 108), as long as angle 306 is less than or equal to about ten degrees. For example, angle 306 may equal zero and, therefore, ferromagnetic layer 106 has direction of magnetization 206 that is equal to direction of magnetization 208 of anti-ferromagnetic layer 108.

Figure 5:
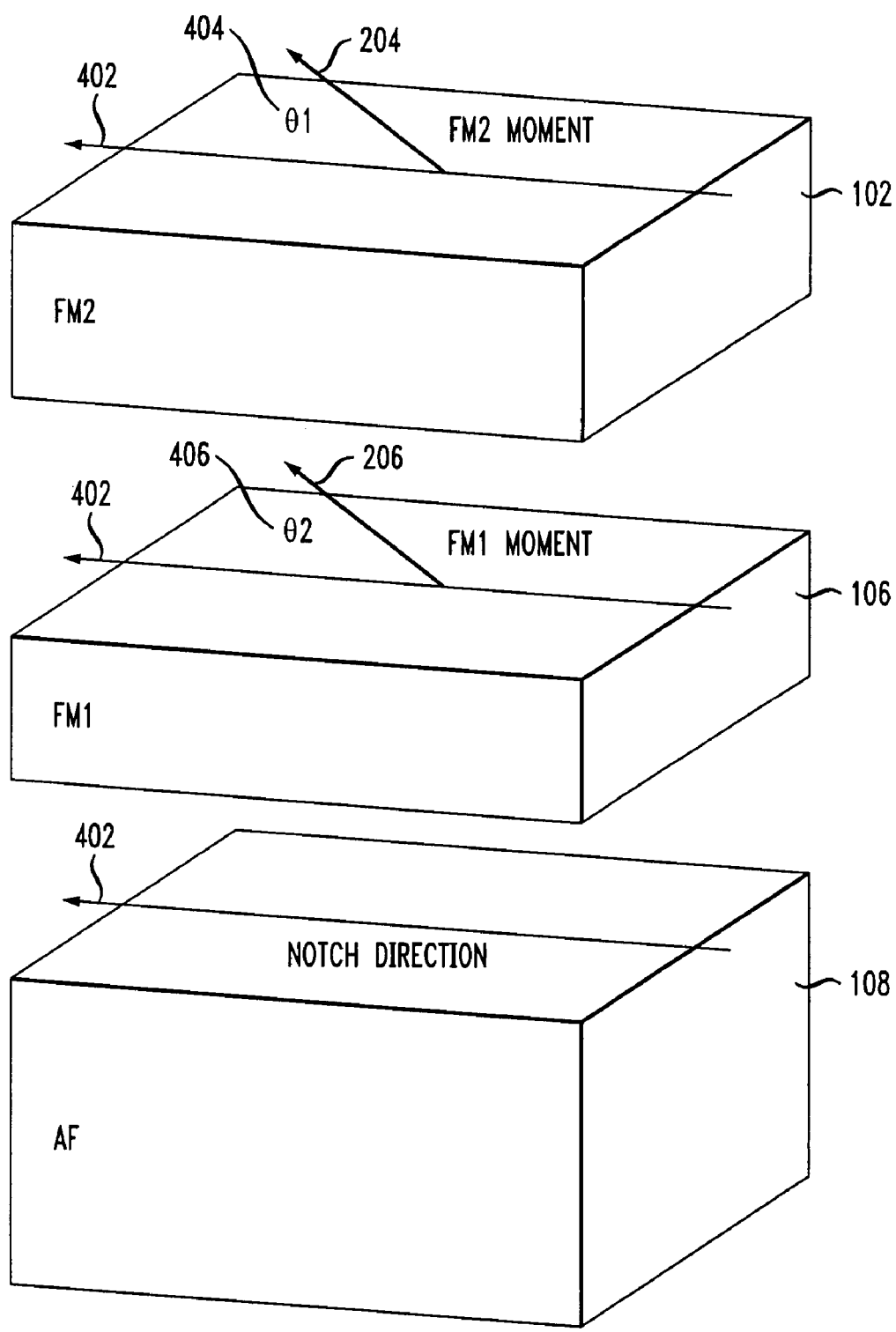
FIG. 5 is an exploded diagram illustrating directions of magnetization of an exemplary reference stack configuration according to an embodiment of the present invention.

FIG. 5 is an exploded diagram illustrating directions of magnetization of an exemplary reference stack configuration. The reference stack layers, e.g., ferromagnetic layer 102, ferromagnetic layer 106 and anti-ferromagnetic layer 108, are shown in an exploded view to better illustrate the magnetization properties of the layers. Namely, FIG. 5 illustrates that the orientations of direction of magnetization 204 and direction of magnetization 206 of ferromagnetic layers 102 and 106, respectively, may be determined based on some physical indicia or alignment guide, e.g., notch 402, on reference stack 100. For example, it may be determined that direction of magnetization 204 and direction of magnetization 206 are oriented at angle 404 and angle 406, respectively, from notch 402 in reference stack 100.

Figure 6:
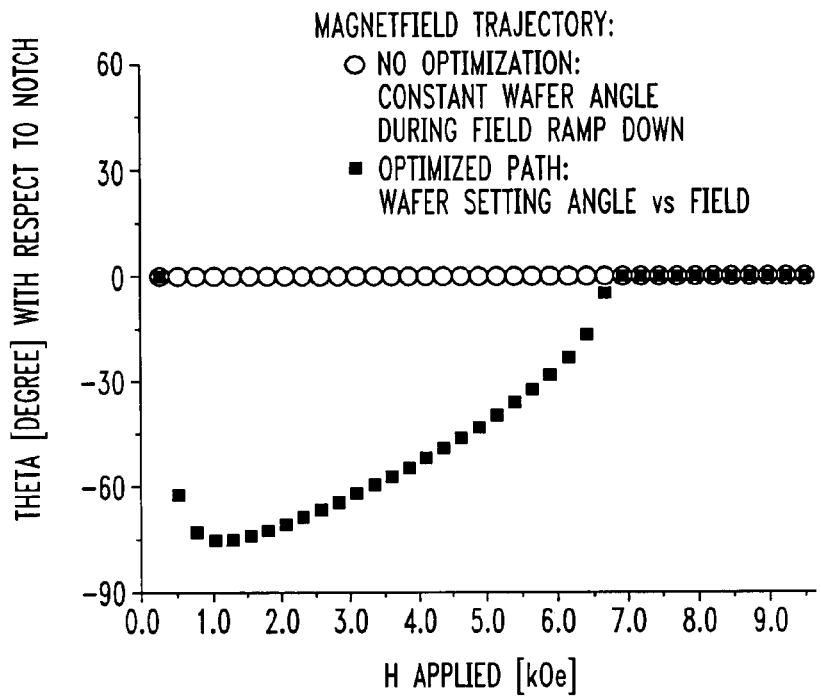
FIG. 6 is a graph illustrating rotating a magnetic device to counteract rotations in direction of magnetization according to an embodiment of the present invention.

FIG. 6 is a graph illustrating rotating a magnetic device to counteract rotations in direction of magnetization. Namely, FIG. 6 illustrates rotating reference stack 100 by up to about 75 degrees in relation to the applied magnetic field during ramp down of the applied magnetic field. The graph shown in FIG. 6 illustrates two instances, one wherein a positioning of reference stack 100 is maintained (labeled "no optimization"), and the other wherein reference stack 100 is rotated to counteract rotations in, e.g., direction of magnetization 206 of ferromagnetic layer 106 (labeled "optimized path"). As described above, the direction of magnetization may be determined based on an orientation of a notch on reference stack 100, although alternative means for determining the direction of magnetization of a given magnetic layer are contemplated by the invention. Similarly, the positioning of reference stack 100 comprises a physical orientation of the stack (e.g., as may be indicated by the orientation of the notch on reference stack 100) and may be based on a desired and/or preferred direction or orientation of reference stack 100, e.g., for subsequent processing steps, such as patterning.

Figure 7:
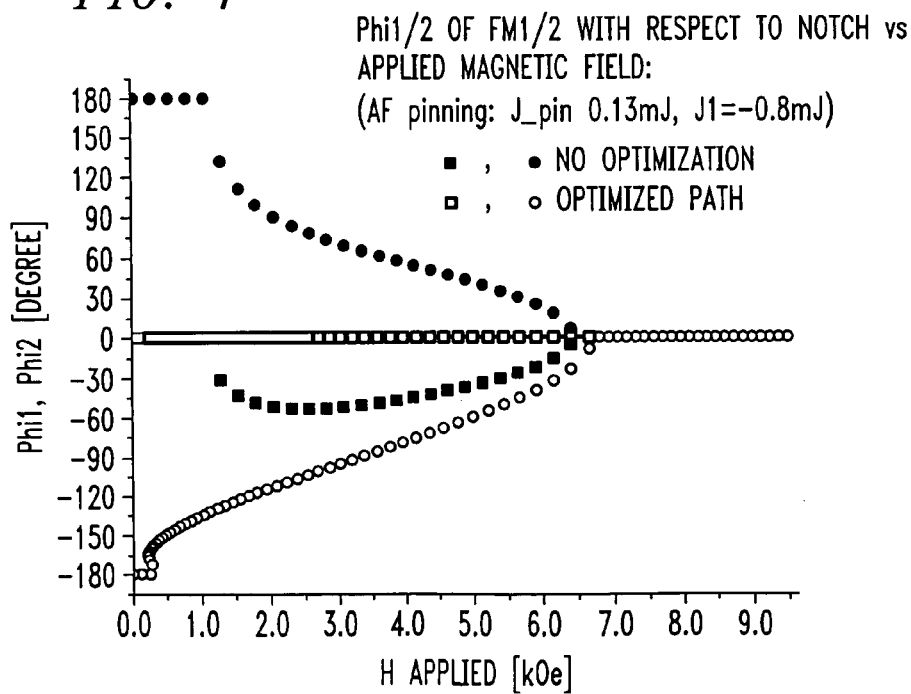
FIG. 7 is a graph illustrating a change in the direction of magnetization of two anti-parallel coupled ferromagnetic layers according to an embodiment of the present invention.

FIG. 7 is a graph illustrating a change in the direction of magnetization of two anti-parallel coupled ferromagnetic layers. Namely, FIG. 7 illustrates rotations in direction of magnetization 204 and direction of magnetization 206 of ferromagnetic layers 102 and 106, respectively, as a function of the strength of the applied magnetic field. The graph illustrates two instances for each of ferromagnetic layers 102 (represented by a circle) and 106 (represented by a square), one wherein the direction of the applied magnetic field in relation to a positioning of reference stack 100 remains constant (labeled "no optimization") and the other wherein the direction of the applied magnetic field is rotated in relation to the positioning of reference stack 100 (labeled "optimized path").

It is apparent from the graph that rotating the direction of the applied magnetic field in relation to a positioning of reference stack 100 during field ramp down can eliminate rotations in direction of magnetization 206 of ferromagnetic layer 106, which are shown to be as high as 60 degrees in the case of no optimization. While the graph in FIG. 7 shows that rotations in direction of magnetization 206 of ferromagnetic layer 106 can be reduced by up to about 100 percent (e.g., eliminated), according to the techniques presented herein, rotating the direction of the applied magnetic field in relation to a direction or orientation of reference stack 100 can reduce rotations in direction of magnetization 206 of ferromagnetic layer 106 by an amount of greater than or equal to about 50 percent. For example, rotating the direction of the applied magnetic field in relation to a positioning of reference stack 100 can reduce rotations in direction of magnetization 206 of ferromagnetic layer 106 by an amount of greater than or equal to about 75 percent.

Further, it is to be understood that the teachings presented herein are broadly applicable to all stages of magnetic device processing, such as, the processing of patterned devices and the processing of extended sheets of material, e.g., prior to patterning.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A method of processing a magnetic device comprising two or more anti-parallel coupled layers, the method comprising the steps of:
    applying a magnetic field in a given direction to orient a direction of magnetization of the two or more anti-parallel coupled layers; and
    rotating the direction of the applied magnetic field in relation to a positioning of the two or more anti-parallel coupled layers to counteract at least a portion of a change in a direction of magnetization experienced by at least one of the two or more anti-parallel coupled layers when the applied magnetic field is reduced.

2. The method of claim 1, wherein the magnetic device further comprises at least one anti-ferromagnetic layer.

3. The method of claim 2, wherein the at least one anti-ferromagnetic layer is used to orient the direction of magnetization of at least one of the two or more anti-parallel coupled layers present in the at least one free layer.

4. The method of claim 2, wherein a direction of magnetization of the at least one anti-ferromagnetic layer is substantially the same as the direction of the applied magnetic field.

5. The method of claim 2, further comprising the step of heating the device to greater than or equal to a temperature wherein an exchange bias between at least one of the two or more anti-parallel coupled layers and the at least one anti-ferromagnetic layer vanishes.

6. The method of claim 5, wherein the device is heated at a temperature of from about 250° C. to about 300° C. for a duration of from about one hour to about five hours.

7. The method of claim 1, wherein at least one of the two or more anti-parallel coupled layers comprise a ferromagnet.

8. The method of claim 1, wherein at least one of the two or more anti-parallel coupled layers comprises multiple layers.

9. The method of claim 8, wherein at least one of multiple layers comprises a ferromagnetic layer.

10. The method of claim 8, wherein at least one of multiple layers comprises an anti-ferromagnetic layer.

11. The method of claim 1, wherein the applied magnetic field is reduced to zero.

12. The method of claim 1, wherein the two or more anti-parallel coupled layers are coupled by one or more spacer layers therebetween.

13. The method of claim 1, wherein the change in the direction of magnetization experienced by the at least one of the two or more anti-parallel coupled layers comprises an angular excursion.

14. The method of claim 1, wherein rotating the direction of the applied magnetic field in relation to the positioning of the two or more anti-parallel coupled layers reduces an amount of change in the direction of magnetization experienced by the at least one of the two or more anti-parallel coupled layers by greater than or equal to about 50 percent.

15. The method of claim 1, wherein rotating the direction of the applied magnetic field in relation to the positioning of the two or more anti-parallel coupled layers reduces an amount of change in the direction of magnetization experienced by the at least one of the two or more anti-parallel coupled layers by greater than or equal to about 75 percent.

16. The method of claim 1, wherein rotating the direction of the applied magnetic field in relation to the positioning of the two or more anti-parallel coupled layers substantially eliminates the change in the direction of magnetization experienced by the at least one of the two or more anti-parallel coupled layers.

17. The method of claim 1, wherein rotating the direction of the applied magnetic field in relation to the positioning of the two or more anti-parallel coupled layers comprises changing the direction of the applied magnetic field while maintaining the positioning of the two or more anti-parallel coupled layers.

18. The method of claim 1, wherein rotating the direction of the applied magnetic field in relation to the positioning of the two or more anti-parallel coupled layers comprises rotating the positioning of the two or more anti-parallel coupled layers while maintaining the direction of the applied magnetic field.

19. The method of claim 1, wherein rotating the direction of the applied magnetic field in relation to the positioning of the two or more anti-parallel coupled layers comprises both changing the direction of the applied magnetic field and rotating the positioning of the two or more anti-parallel coupled layers.

20. A magnetic device comprising two or more anti-parallel coupled layers, the magnetic device being formed comprising the steps of:

applying a magnetic field in a given direction to orient a direction of magnetization of the two or more anti-parallel coupled layers; and rotating the direction of the applied magnetic field in relation to a positioning of the two or more anti-parallel coupled layers to counteract at least a portion of a change in a direction of magnetization experienced by at least one of the two or more anti-parallel coupled layers when the applied magnetic field is reduced.

* * * * *